United States Patent
Kususaki

(10) Patent No.: US 9,503,655 B2
(45) Date of Patent: Nov. 22, 2016

(54) PHOTOELECTRIC CONVERSION APPARATUS AND PHOTOELECTRIC CONVERSION SYSTEM

(71) Applicant: CANON KABUSHIKI KAISHA, Tokyo (JP)

(72) Inventor: Tomoki Kususaki, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 9 days.

(21) Appl. No.: 14/615,293

(22) Filed: Feb. 5, 2015

(65) Prior Publication Data
US 2015/0228686 A1 Aug. 13, 2015

(30) Foreign Application Priority Data

Feb. 7, 2014 (JP) ................... 2014-022535

(51) Int. Cl.
*H04N 5/235* (2006.01)
*H01L 27/146* (2006.01)
*H04N 5/238* (2006.01)

(52) U.S. Cl.
CPC ........ *H04N 5/238* (2013.01); *H01L 27/14612* (2013.01); *H01L 27/14643* (2013.01)

(58) Field of Classification Search
None
See application file for complete search history.

(56) References Cited

U.S. PATENT DOCUMENTS

| 8,253,090 B2 * | 8/2012 | Barbier | H04N 5/2355 250/208.1 |
| 8,471,937 B2 * | 6/2013 | Saito | H04N 5/3692 348/294 |
| 2012/0235021 A1 * | 9/2012 | Kasai | H04N 5/35527 250/208.1 |
| 2012/0327278 A1 * | 12/2012 | Oike | H01L 27/14609 348/294 |

FOREIGN PATENT DOCUMENTS

JP 2013-054333 A 3/2013

\* cited by examiner

*Primary Examiner* — Mark Monk
(74) *Attorney, Agent, or Firm* — Canon USA, INC. IP Division

(57) ABSTRACT

A photoelectric conversion apparatus includes a first unit pixel including a first transfer transistor configured to transfer electric charges from a photoelectric conversion unit to an impurity diffusion region and a second unit pixel including a second transfer transistor configured to transfer electric charges from a photoelectric conversion unit to an impurity diffusion region, and a potential at a channel of the first transfer transistor when the first transfer transistor is on-state is higher than a potential at a channel of the second transfer transistor when the second transfer transistor is on-state.

20 Claims, 13 Drawing Sheets

PHOTOELECTRIC CONVERSION APPARATUS AND PHOTOELECTRIC CONVERSION SYSTEM

BACKGROUND OF THE INVENTION

1. Field of the Invention

The present invention relates to a photoelectric conversion apparatus and a photoelectric conversion system.

2. Description of the Related Art

A photoelectric conversion apparatus for phase difference detection-type auto focusing (AF) has been proposed (for example, see Japanese Patent Laid-Open No. 2013-54333). An electric charge monitoring pixel has a configuration for transferring electric charges generated in a photoelectric conversion element during an electric charge accumulating period to a memory unit and integrating the electric charges in the memory unit. An electric charge accumulating pixel integrates the electric charges generated in the photoelectric conversion element during the electric charge accumulating period in its pixel without transferring the electric charges to the memory unit until the end of the electric charge accumulating period. Subsequently, when the electric charge accumulating period is ended, the electric charge accumulating pixel transfers the electric charges generated in the photoelectric conversion element to the memory unit.

SUMMARY OF THE INVENTION

An photoelectric conversion apparatus according to an aspect of the present invention includes a first unit pixel and a second unit pixel, in which the first unit pixel includes a first photoelectric conversion unit, a first transfer transistor, and a first impurity diffusion region, the second unit pixel includes a second photoelectric conversion unit, a second transfer transistor, and a second impurity diffusion region, the first transfer transistor transfers electric charges generated by the first photoelectric conversion unit to the first impurity diffusion region when the first transfer transistor is turned on during an electric charge accumulating period, the second photoelectric conversion unit accumulates generated electric charges during the electric charge accumulating period, and the second transfer transistor transfers the electric charges generated by the second photoelectric conversion unit to the second impurity diffusion region when the second transfer transistor is turned on after the electric charge accumulating period is ended, and a potential at a channel of the first transfer transistor when the first transfer transistor is on-state is higher than a potential at a channel of the second transfer transistor when the second transfer transistor is on-state.

Further features of the present invention will become apparent from the following description of exemplary embodiments with reference to the attached drawings.

DESCRIPTION OF THE EMBODIMENTS

In a case where an on-state voltage appropriate to one pixel is set, an issue that a linearity is decreased in the other pixel exists in a configuration according to Japanese Patent Laid-Open No. 2013-54333.

According to respective exemplary embodiments that will be described below, a photoelectric conversion apparatus and a photoelectric conversion system are provided in which a linearity of characteristics of unit pixels is satisfied in both a pixel where electric charges of a photoelectric conversion element are transferred during an electric charge accumulating period and a pixel where electric charges of the photoelectric conversion element are transferred after the electric charge accumulating period is ended.

First Exemplary Embodiment

Figure 1:
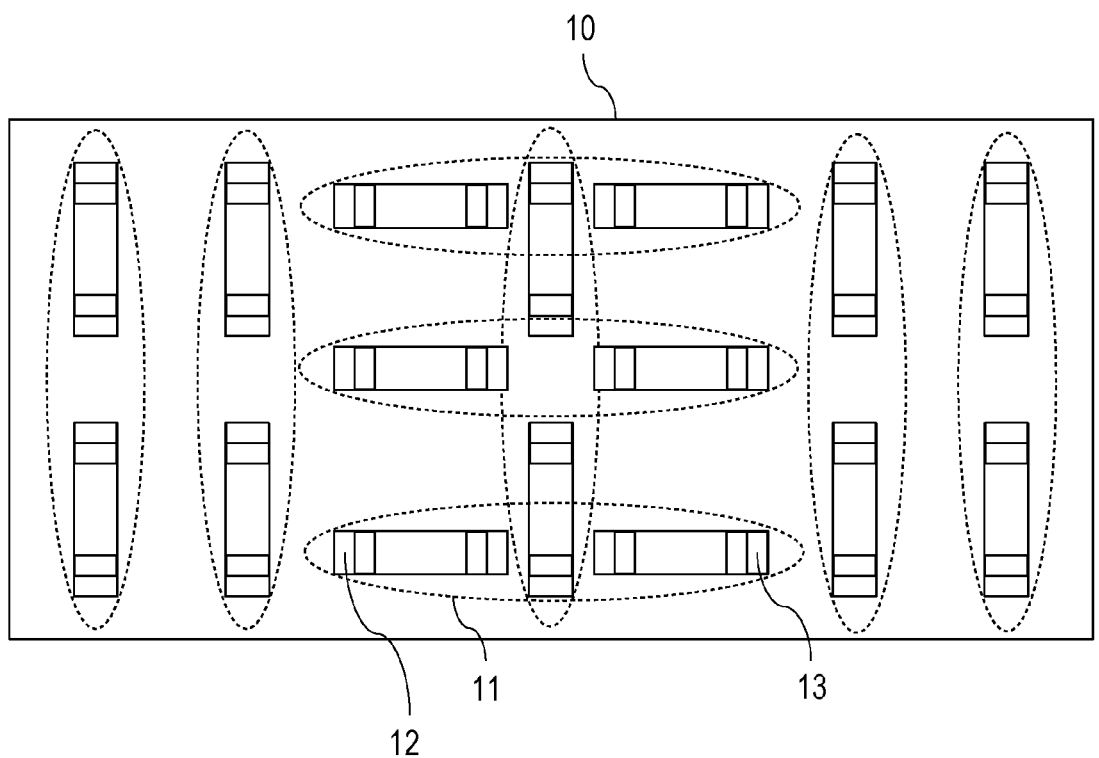
FIG. 1 is a layout diagram of line sensors of a photoelectric conversion apparatus for phase difference detection-type auto focusing.

FIG. 1 illustrates an arrangement layout for line sensors of a photoelectric conversion apparatus 10 for phase difference detection-type auto focusing according to a first exemplary embodiment of the present invention. The photoelectric conversion apparatus 10 includes a plurality of line sensor pairs 11. The line sensor pair 11 includes a base unit line sensor 12 and a reference unit line sensor 13. The base unit line sensor 12 and the reference unit line sensor 13 are irradiated with light corresponding to positional information. A photoelectric conversion system compares output signals of the base unit line sensor 12 and the reference unit line sensor 13 to each other to perform phase difference detection and obtains a de-focusing amount.

Figure 2:
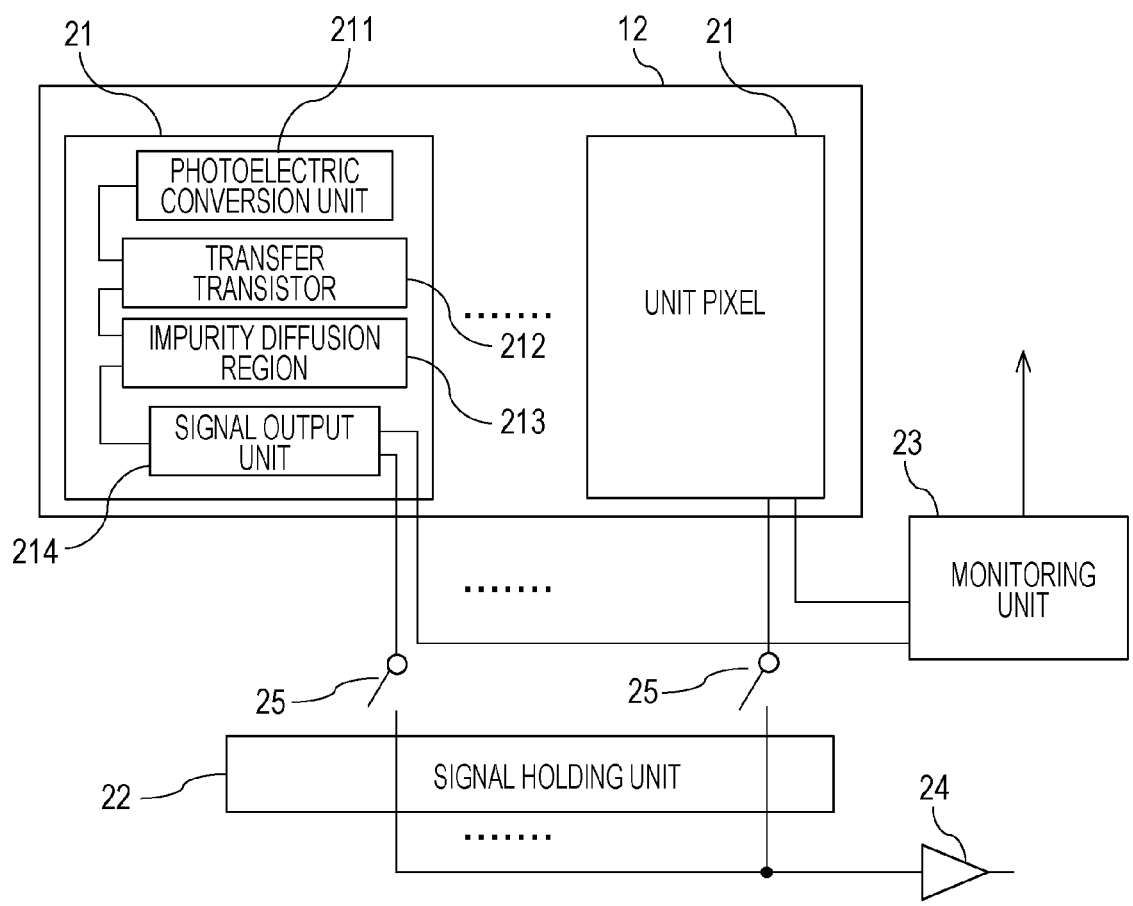
FIG. 2 illustrates a configuration of the line sensor according to a first exemplary embodiment.

FIG. 2 illustrates an example configuration of the base unit line sensor 12 and its peripheral circuit. The base unit line sensor 12 includes a plurality of unit pixels 21 and is connected to a signal holding unit 22 and a monitoring unit 23. The unit pixel 21 includes a photoelectric conversion unit 211, a transfer transistor 212, an impurity diffusion region 213, and a signal output unit 214. The signal output unit 214 is, for example, a buffer amplifier. An amplifier 24 is an output buffer amplifier. Switches 25 are sampling and holding switches configured to hold output signals of the signal output units 214 in the plurality of unit pixels 21 in the signal holding unit 22. The photoelectric conversion unit 211 generates electric charges by photoelectric conversion. The impurity diffusion region 213 accumulates the electric charges. The transfer transistor 212 transfers the electric charges generated by the photoelectric conversion unit 211 to the impurity diffusion region 213. The impurity diffusion region 213 converts the electric charges to a voltage value V on the basis of a quantity Q of the electric charges transferred to the impurity diffusion region 213 and a capacitance C of the impurity diffusion region 213 by the following Expression (1) and outputs the voltage value V to the signal output unit 214.

$$V=Q/C \quad (1)$$

The signal output units 214 of the respective unit pixels 21 amplify the voltage value V to be output to the signal holding unit 22 and the monitoring unit 23. The respective unit pixels 21 may include noise reduction circuits to improve an accuracy of the phase difference detection. The signal holding unit 22 temporarily holds the output signals of the signal output units 214 in the plurality of unit pixels 21 and subsequently outputs the held signals to the amplifier 24. The amplifier 24 amplifies and outputs the input signal. The amplifier 24 is an amplification unit configured to amplify the signal based on the electric charges generated by the photoelectric conversion unit 211.

The output signals of the signal output units 214 in the plurality of unit pixels 21 are used to detect a light reception amount of the photoelectric conversion unit 211 in real time. The monitoring unit 23 outputs a signal based on a difference signal between a highest value and a lowest value among the output signals of the signal output units 214 in the plurality of unit pixels 21 (hereinafter, will be referred to as P-B signal). Since the reference unit line sensor 13 is similar to the base unit line sensor 12, descriptions thereof will be omitted.

Figure 3:
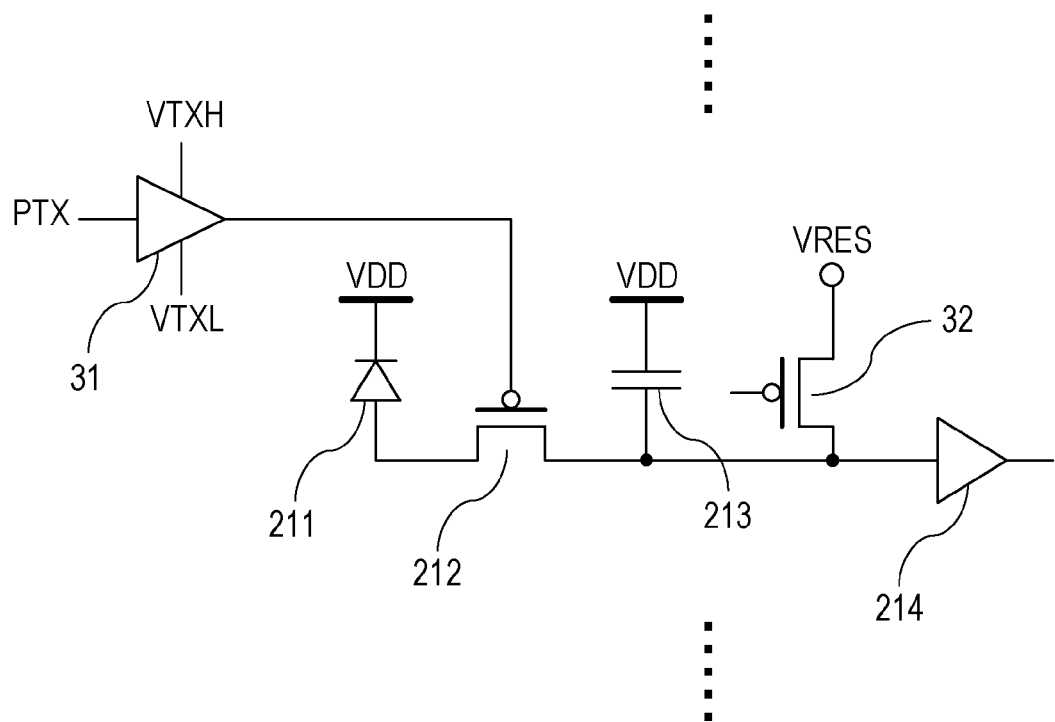
FIG. 3 is an equivalent circuit diagram of the line sensor according to the first exemplary embodiment.

FIG. 3 is an equivalent circuit diagram illustrating an example configuration of the base unit line sensor 12. As illustrated in FIG. 2, a plurality of the same unit pixels 21 are arranged in the base unit line sensor 12. Here, the unit pixel 21 will be described. In FIG. 3, the same component members as those in FIG. 2 are assigned with the same reference symbols. The photoelectric conversion unit 211 is a photodiode. The transfer transistor 212 is a p-channel field effect transistor. The signal output unit 214 is a buffer amplifier. A voltage VRES is a reset voltage for resetting the photoelectric conversion unit 211 and the impurity diffusion region 213 to an initial state. A transistor 32 is a reset transistor configured to reset the photoelectric conversion unit 211 and the impurity diffusion region 213 to the reset voltage VRES. A buffer amplifier 31 is an amplifier configured to transmit a control signal PTX to a gate of the transfer transistor 212. When the buffer amplifier 31 outputs a low level voltage (on-state voltage) VTXL to the gate of the transfer transistor 212 on the basis of the control signal PTX at a low level, the transfer transistor 212 is turned on, and the electric charges of the photoelectric conversion unit 211 are transferred to the impurity diffusion region 213. On the other hand, when the buffer amplifier 31 outputs a high level voltage (off-state voltage) VTXH to the gate of the transfer transistor 212 on the basis of the control signal PTX at a high level, the transfer transistor 212 is turned off. The reference unit line sensor 13 is similar to the base unit line sensor 12.

The unit pixel 21 are divided into an electric charge monitoring unit pixel (first unit pixel) 21 and an electric charge accumulating unit pixel (second unit pixel) 21. The plurality of unit pixels 21 arranged in one base unit line sensor 12 are the electric charge monitoring unit pixels 21, and the plurality of unit pixels 21 arranged in the other base unit line sensor 12 are the electric charge accumulating unit pixels 21. The reference unit line sensor 13 is also similar to the base unit line sensor 12. The electric charge monitoring unit pixel 21 and the electric charge accumulating unit pixel 21 have the same configuration, and driving methods are different from each other.

The electric charge monitoring unit pixel 21 transfers the electric charges generated by the photoelectric conversion unit 211 to the impurity diffusion region 213 during the electric charge accumulating period to monitor the light reception amount of the photoelectric conversion unit 211. The electric charge accumulating unit pixel 21 accumulates the electric charges generated by the photoelectric conversion unit 211 in the photoelectric conversion unit 211 without monitoring the light reception amount of the photoelectric conversion unit 211, and transfers the electric charges of the photoelectric conversion unit 211 to the impurity diffusion region 213 after the end of the electric charge accumulating period.

After the start of the electric charge accumulating period of the electric charge monitoring unit pixel 21 and the electric charge accumulating unit pixel 21, the monitoring unit 23 calculates the difference signal (P-B signal) between the highest value and the lowest value among the output values (light reception amounts) of the plurality of electric charge monitoring unit pixels 21 and compares the P-B signal with a threshold. In a case where the P-B signal exceeds the threshold, the electric charge accumulating period of the electric charge monitoring unit pixel 21 and the electric charge accumulating unit pixel 21 is ended. As described above, the light reception amount of the electric charge monitoring unit pixel 21 is monitored, and the appropriate electric charge accumulating period can be determined in a state in which the transfer transistor 212 is turned on during the electric charge accumulating period.

Since the electric charge accumulating unit pixel 21 accumulates the electric charges in the photoelectric conversion unit 211 during the electric charge accumulating period, and the noise generated in the impurity diffusion region 213 during the electric charge accumulating period does not affect the electric charges accumulated in the photoelectric conversion unit 211, it is possible to generate a high S/N signal. In addition, since the electric charge accumulating unit pixel 21 resets the impurity diffusion region 213 during the electric charge accumulating period and transfers the electric charges of the photoelectric conversion unit 211 to the impurity diffusion region 213 after the end of the electric charge accumulating period, it is possible to remove the noise generated in the impurity diffusion region 213. Accordingly, the electric charge accumulating unit pixel 21 can output a pixel signal of a high image quality.

Figure 4:
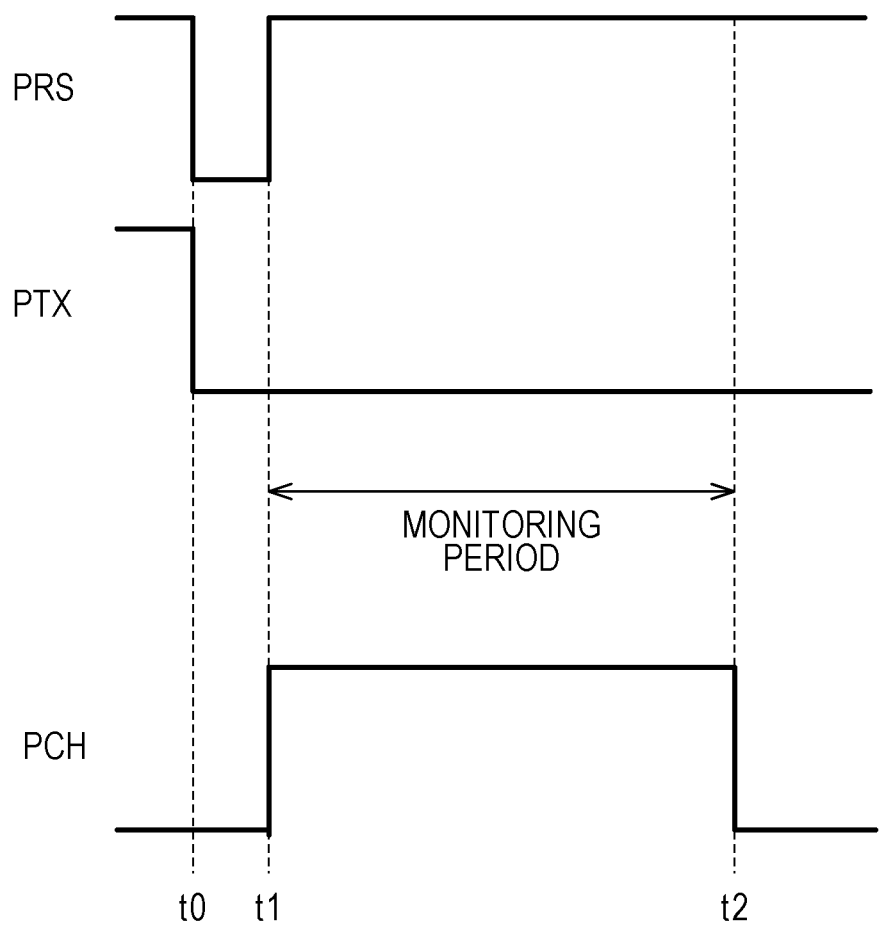
FIG. 4 illustrates a driving timing according to the first exemplary embodiment.

FIG. 4 is a timing chart illustrating a driving method of the electric charge monitoring unit pixel 21. Since the electric charge monitoring unit pixel 21 monitors the light reception amount of the photoelectric conversion unit 211, the electric charges generated by the photoelectric conversion unit 211 are transferred to the impurity diffusion region 213 during the electric charge accumulating period. A signal PRS is a signal for controlling a gate of the transistor 32 in FIG. 3. A signal PTX is a signal for controlling the gate of the transfer transistor 212. A monitoring period is a period for the monitoring unit 23 in FIG. 2 to monitor the output signal of the signal output unit 214. A signal PCH is a signal for controlling the switch 25 in FIG. 2. When the signal PCH is at a high level, the switch 25 is put into an on-state, and when the signal PCH is at a low level, the switch 25 is put into an off-state. Here, the transfer transistor 212 and the transistor 32 in FIG. 3 are p-channel MOS field effect transistors. For that reason, when the signals PTX and PRS are at the high level, the transfer transistor 212 and the transistor 32 are respectively put into the off-state, and when the signals PTX and PRS are at the low level, the transfer transistor 212 and the transistor 32 are respectively put into the on-state.

A period from a time t0 to a time t1 is an initial reset period. Since the signals PRS and PTX are at the low level, and the transistor 32 and the transfer transistor 212 are in the on-state, the potential at the photoelectric conversion unit 211 and the impurity diffusion region 213 are reset to the voltage VRES. A period from the time t1 to a time t2 is an electric charge accumulating period. During the electric charge accumulating period, the signal PTX turns to the low level. Then, the transfer transistor 212 is turned on to transfer the electric charges generated by the photoelectric conversion unit 211 to the impurity diffusion region 213. During this electric charge accumulating period, no issue occurs in principle even if the signal PTX is regularly at the low level or performs intermittent operation to change to the low level and the high level in repeating fashion. During the electric charge accumulating period, the signal PCH is at the high level, and the switch 25 is turned on, so that the output signal of the signal output unit 214 is output to the signal holding unit 22. This electric charge accumulating period is also the monitoring period during which the monitoring unit 23 monitors the output signal of the signal output unit 214. After the time t2, the signal PCH turns to the low level, and the switch 25 is turned off, so that the signal holding unit 22 holds the output signal of the signal output unit 214 at the time t2. After the time t2, this period is a signal reading period.

Figure 5:
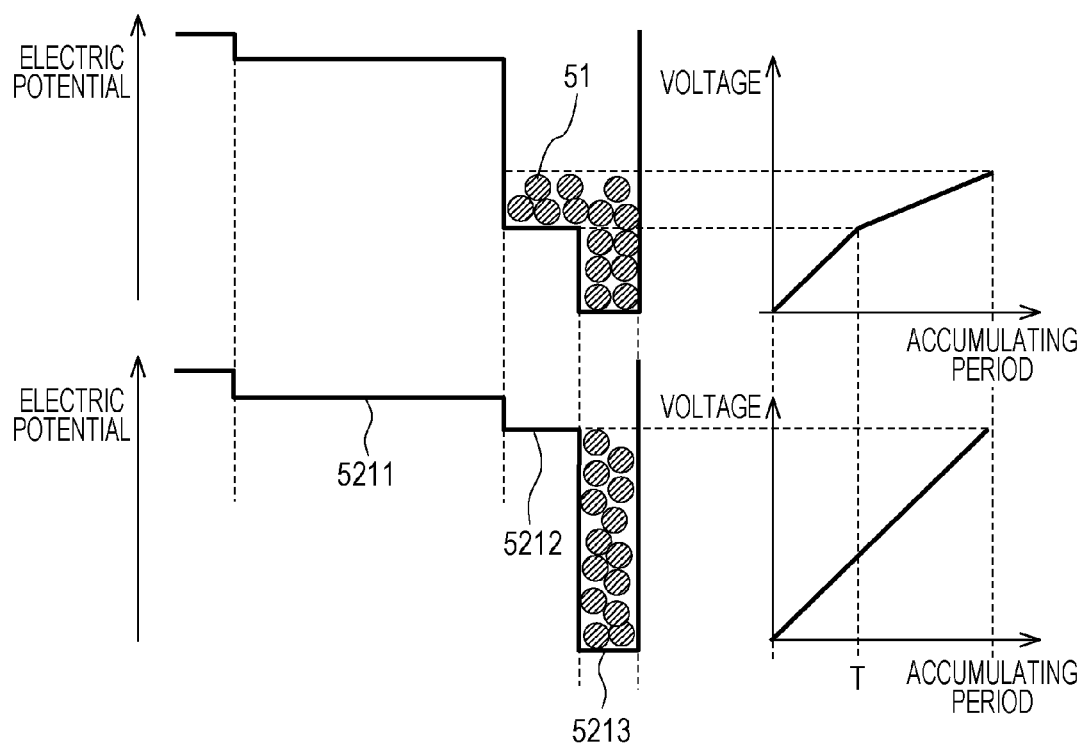
FIG. 5 illustrates a relationship between an electric potential at a pixel unit and an output voltage.

FIG. 5 is an explanatory diagram for describing electric charge transfer of the electric charge monitoring unit pixel 21 and its characteristics. In FIG. 5, the top drawing is for describing an issue of a decrease in the linearity, and the bottom drawing is for describing measures against the issue. The drawing on the left is a schematic diagram of a potential 5211 at the photoelectric conversion unit 211, a potential 5212 at the channel of the transfer transistor 212, a potential 5213 of the impurity diffusion region 213, and electric charges 51 generated by the photoelectric conversion unit 211 at the time t2. The drawing on the right illustrates a relationship between the voltage held at the signal holding unit 22 when the electric charge accumulating period is changed and the electric charge accumulating period.

In the top drawing, the linearity is decreased after a time T. This is because the electric charges 51 sneak under the gate of the transfer transistor 212 since the potential 5212 at the channel of the transfer transistor 212 is high, and the apparent capacitance C is increased. As may be understood from the above-described Expression (1) too, when the capacitance C is increased, the voltage V to be output is decreased. On the other hand, in the bottom drawing, since the potential 5212 at the channel of the transfer transistor 212 is high, the electric charges 51 do not sneak under the gate of the transfer transistor 212. For that reason, the linearity is not decreased.

As described above, at the time of the operation of transferring the electric charges 51 generated by the photoelectric conversion unit 211 to the impurity diffusion region 213 during the electric charge accumulating period, when the potential 5212 at the channel of the transfer transistor 212 is low, the linearity is decreased from the time T. To solve this, the potential 5212 at the channel of the transfer transistor 212 is to be increased.

Figure 6:
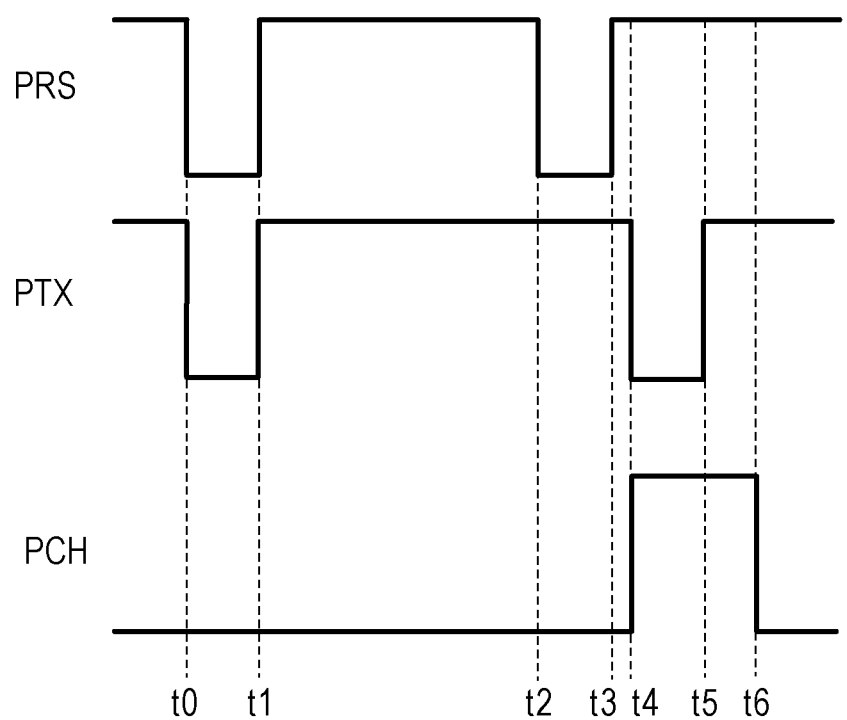
FIG. 6 illustrates a driving timing according to the first exemplary embodiment.

FIG. 6 is a timing chart illustrating the driving method of the electric charge accumulating unit pixel 21. The electric charge accumulating unit pixel 21 is a unit pixel where the light reception amount of the photoelectric conversion unit 211 is not monitored. During the electric charge accumulating period, the electric charge accumulating unit pixel 21 accumulates the electric charges generated by the photoelectric conversion unit 211 in the photoelectric conversion unit 211 without transferring the electric charges, and transfers the electric charges generated by the photoelectric conversion unit 211 to the impurity diffusion region 213 after the end of the electric charge accumulating period. Since the symbols of the respective signals and the correspondences between the respective signals and the circuit operations are the same as those in FIG. 4, descriptions thereof will be omitted.

A period from a time t0 to a time t1 is an initial reset period. Since the signals PRS and PTX are at the low level, and the transistor 32 and the transfer transistor 212 are in the on-state, the potential at the photoelectric conversion unit 211 and the impurity diffusion region 213 are reset to the voltage VRES. A period from the time t1 to a time t2 is an electric charge accumulating period. During the electric charge accumulating period, the signal PTX turns to the high level, and the transfer transistor 212 is put into the off-state, so that the photoelectric conversion unit 211 accumulates generated electric charges. A period from the time t2 to a time t3 is a pre-electric charge transfer reset period. The signal PRS turns to the low level, and the signal PTX maintains at the high level. Then, the transistor 32 is turned on, and the potential at the impurity diffusion region 213 is reset to the voltage VRES again. With this operation, it is possible to remove noise accumulated in the impurity diffusion region 213 during the electric charge accumulating period, and the high S/N signal can be obtained. A period from the time T3 to a time t4 is a blank period during which the signal PRS turns to the high level, and the transistor 32 is turned off, so that the on-state of the transfer transistor 212 is not established. At the time T4, the signal PCH turns to the high level, and the switch 25 is turned on. Then, sampling for the signal holding unit 22 of the output signal of the signal output unit 214 is started. A period from the time T4 to a time t5 is an electric charge transferring period. During this period, the signal PTX turns to the low level, and the transfer transistor 212 transfers the electric charges from the photoelectric conversion unit 211 to the impurity diffusion region 213. At a time t6, the signal PCH turns to the low level, and the signal holding unit 22 holds the output signal of the signal output unit 214 at the time t6. After the time t6, this period is a signal reading period.

Figure 7:
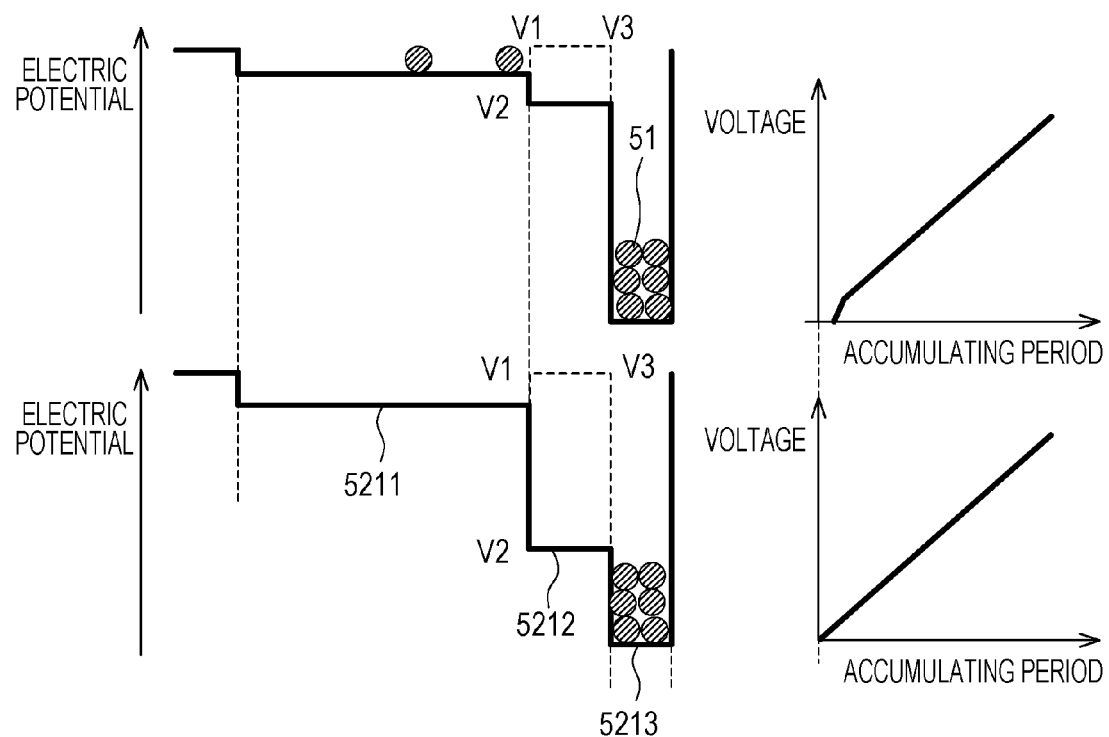
FIG. 7 illustrates a relationship between the electric potential at the pixel unit and the output voltage.

FIG. 7 is an explanatory diagram for describing electric charge transfer of the electric charge accumulating unit pixel 21 and signal characteristics. In FIG. 7, the top drawing is for describing an issue of a decrease in the linearity at a low luminance, and the bottom drawing is for describing measures against the issue. Since reference symbols and the like in FIG. 7 are the same as those in FIG. 5, descriptions thereof will be omitted. The drawing on the left is an explanatory diagram for describing electric charge accumulation and electric charge transfer. V1 denotes a potential during the electric charge accumulating period. V2 denotes a potential during the electric charge transferring period. V3 denotes a potential after the electric charge transferring period.

In the top drawing, the linearity of the output signal during a short electric charge accumulating period is decreased. This is because a transfer efficiency is decreased since a channel resistance is high. As may be apparent from the drawing on the left representing the issue, the potential 5212 at the channel of the transfer transistor 212 is high during the electric charge transferring period, and it may be understood that the on-state voltage related to the gate of the transfer transistor 212 is not sufficient. On the other hand, in the bottom drawing representing the solution, since the potential 5212 at the channel of the transfer transistor 212 is low, and the on-state voltage is sufficiently applied, the transfer defect hardly occurs. As a result, in the schematic diagram on the bottom right representing the solution, the decrease in the linearity hardly occurs.

The phenomenon where the electric charges sneak under the gate of the transfer transistor 212 corresponding to the issue in the timing of FIG. 4 does not become an issue in the timing of FIG. 6. This is because the electric charges under the gate of the transfer transistor 212 are moved to the impurity diffusion region 213 since the signal PTX turns to the high level at the time t6 for sampling and holding, and the transfer transistor 212 is turned on.

As described above, the light reception amount of the photoelectric conversion unit 211 is not monitored in the electric charge accumulating unit pixel 21 of FIG. 6 and FIG. 7, and the electric charges generated by the photoelectric conversion unit 211 are accumulated in the photoelectric conversion unit 211. Then, the electric charges of the photoelectric conversion unit 211 are transferred to the impurity diffusion region 213 after the end of the electric charge accumulating period. At the time of this operation, if the potential 5212 at the channel of the transfer transistor 212 is high, the linearity is decreased during the short electric charge accumulating period. To solve this, the potential 5212 at the channel of the transfer transistor 212 is to be decreased.

According to the present exemplary embodiment, the on-state voltage of the transfer transistor 212 in the electric charge monitoring unit pixel 21 in FIG. 4 and FIG. 5 is set to be higher than the on-state voltage of the transfer transistor 212 in the electric charge accumulating unit pixel 21 in FIG. 6 and FIG. 7. Accordingly, the electric charges do not sneak under the gate of the transfer transistor 212 in the electric charge monitoring unit pixel 21 in FIG. 4 and FIG. 5, and the transfer efficiency is increased in the electric charge accumulating unit pixel 21 of FIG. 6 and FIG. 7. As a result, it is possible to improve the linearity of both the electric charge monitoring unit pixel 21 and the electric charge accumulating unit pixel 21.

According to the present exemplary embodiment, the descriptions have been made while the transfer transistor 212 and the transistor 32 are constituted by the p-channel MOS field effect transistors, but the same benefit as the above-described benefit can be attained by reversing the voltage relationship in the case of n-channel MOS field effect transistors.

In addition, according to the present exemplary embodiment, the on-state voltage supplied to the electric charge monitoring unit pixel 21 is set to be different from the on-state voltage supplied to the electric charge accumulating unit pixel 21, but the configuration is not limited to this. A threshold voltage of the transfer transistor 212 in the electric charge monitoring unit pixel 21 may be set to be higher than a threshold voltage of the transfer transistor 212 in the electric charge accumulating unit pixel 21. In that case, the gates of the transfer transistor 212 in the electric charge monitoring unit pixel 21 and the transfer transistor 212 in the electric charge accumulating unit pixel 21 are supplied with the same on-state voltage. In this case too, the same benefit as the above-described benefit can be attained.

As described above, the potential 5212 at the channel when the transfer transistor 212 in the electric charge monitoring unit pixel 21 in the bottom drawing of FIG. 5 is turned on is higher than the potential 5212 at the channel when the transfer transistor 212 in the electric charge accumulating unit pixel 21 in the bottom drawing of FIG. 7 is turned on. Specifically, the following cases (1) to (4) are conceivable.

(1) The transfer transistors 212 in the electric charge monitoring unit pixel 21 and the electric charge accumulating unit pixel 21 are the p-channel MOS field effect transistors. In that case, the on-state voltage VTXL of the gate for turning on the transfer transistor 212 in the electric charge monitoring unit pixel 21 is higher than the on-state voltage VTXL of the gate for turning on the transfer transistor 212 in the electric charge accumulating unit pixel 21.

(2) The transfer transistors 212 in the electric charge monitoring unit pixel 21 and the electric charge accumulating unit pixel 21 are the n-channel MOS field effect transistors. In that case, the on-state voltage VTXH of the gate for turning on the transfer transistor 212 in the electric charge monitoring unit pixel 21 is lower than the on-state voltage VTXH of the gate for turning on the transfer transistor 212 in the electric charge accumulating unit pixel 21.

(3) The transfer transistors 212 in the electric charge monitoring unit pixel 21 and the electric charge accumulating unit pixel 21 are the p-channel MOS field effect transistors. In that case, the threshold voltage of the transfer transistor 212 in the electric charge monitoring unit pixel 21 is higher than the threshold voltage of the transfer transistor 212 in the electric charge accumulating unit pixel 21. The on-state voltage VTXL of the gate for turning on the transfer transistor 212 in the electric charge monitoring unit pixel 21 is the same as the on-state voltage VTXL of the gate for turning on the transfer transistor 212 in the electric charge accumulating unit pixel 21.

(4) The transfer transistors 212 in the electric charge monitoring unit pixel 21 and the electric charge accumulating unit pixel 21 are the n-channel MOS field effect transistors. In that case, the threshold voltage of the transfer transistor 212 in the electric charge monitoring unit pixel 21 is lower than the threshold voltage of the transfer transistor 212 in the electric charge accumulating unit pixel 21. The on-state voltage VTXH of the gate for turning on the transfer transistor 212 in the electric charge monitoring unit pixel 21 is the same as the on-state voltage VTXH of the gate for turning on the transfer transistor 212 in the electric charge accumulating unit pixel 21.

In addition, in the above-described cases (1) and (2), the on-state voltage supplied to the gate of the transfer transistor 212 in the electric charge accumulating unit pixel 21 can be set as a voltage at which complete transfer can be performed. Accordingly, the electric charges of the electric charge accumulating unit pixel 21 can be completely transferred, and the satisfactory linearity characteristics can be obtained. In addition, in the above-described cases (1) and (2), a voltage difference between the on-state voltage and the off-state voltage supplied to the gate of the transfer transistor 212 in the electric charge monitoring unit pixel 21 is smaller than a voltage difference between the on-state voltage and the off-state voltage supplied to the gate of the transfer transistor 212 in the electric charge accumulating unit pixel 21.

It is noted that, according to the present exemplary embodiment, the case where each of the unit pixels 21 includes the photoelectric conversion unit 211, the transfer transistor 212, the impurity diffusion region 213, and the signal output unit 214 has been described, but other configurations may also be adopted. Hereinafter, another example of the unit pixel 21 will be described. One unit pixel 21 includes the plurality of photoelectric conversion units 211. The one unit pixel 21 also includes the impurity diffusion region 213. The one unit pixel 21 further includes a first transfer transistor as the transfer transistor 212 which is configured to transfer the electric charges accumulated by a part of the photoelectric conversion units 211 among the plurality of photoelectric conversion units 211 to the impurity diffusion region 213. Furthermore, the one unit pixel 21 includes a second transfer transistor as the transfer transistor 212 which is configured to transfer the electric charges accumulated by another part of the photoelectric conversion units 211 among the plurality of photoelectric conversion units 211 to the impurity diffusion region 213. In the unit pixel 21 of this example too, the potential at the channel of the first transfer transistor is set to be higher than the potential at the channel of the second transfer transistor, so that the above-described benefits of the photoelectric conversion apparatus according to the present exemplary embodiment can be attained.

Second Exemplary Embodiment

Figure 8:
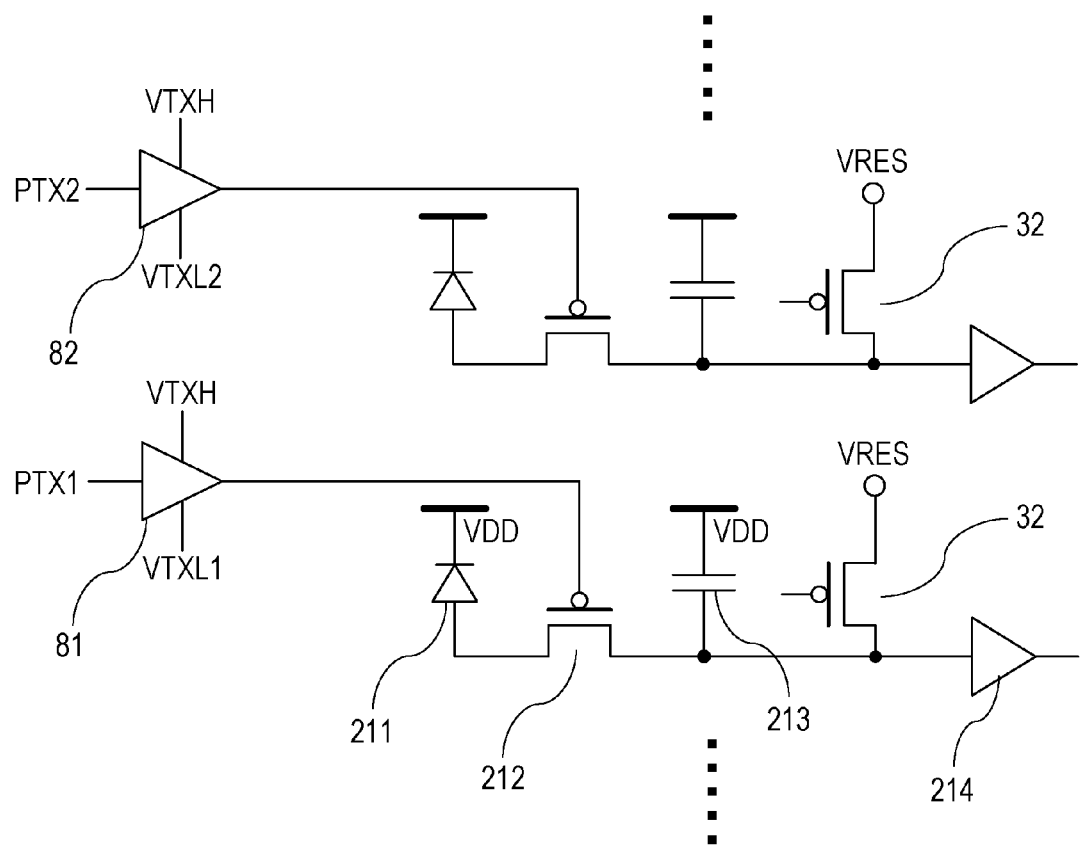
FIG. 8 is an equivalent circuit diagram of the pixel unit according to a second exemplary embodiment.

FIG. 8 is an equivalent circuit diagram illustrating an example configuration of the base unit line sensor 12 according to a second exemplary embodiment of the present invention. A plurality of two types of the unit pixels 21 are arranged in the base unit line sensor 12. Here, the two types of the unit pixels 21 will be described. In FIG. 8, the same component members as those in FIG. 3 are assigned with the same reference symbols. A difference of the present exemplary embodiment from the first exemplary embodiment resides in that only the configuration is constituted by one type of the unit pixels 21 according to the first exemplary embodiment (FIG. 3), but two types of buffer amplifiers 81 and 82 corresponding to two types of the unit pixels 21 are provided according to the second exemplary embodiment (FIG. 8). The buffer amplifiers 81 and 82 of FIG. 8 are provided instead of the buffer amplifiers 31 of FIG. 3. The buffer amplifier 81 has an input voltage PTX1, an output voltage VTXH at the high level, and an output voltage VTXL1 at the low level. The buffer amplifier 82 has an input voltage PTX2, an output voltage VTXH at the high level, and an output voltage VTXL2 at the low level. The low level voltage VTXL1 of the buffer amplifier 81 is different from the low level voltage VTXL2 of the buffer amplifier 82. The unit pixel 21 having the buffer amplifier 82 is an electric charge accumulating unit pixel and uses the low level voltage VTXL2. The unit pixel 21 having the buffer amplifier 81 is an electric charge monitoring unit pixel and uses the low level voltage VTXL1. The reference unit line sensor 13 is similar to the base unit line sensor 12. The low level voltage VTXL1 of the buffer amplifier 81 and the low level voltage VTXL2 of the buffer amplifier 82 have a relationship of VTXL1>VTXL2.

Figure 9:
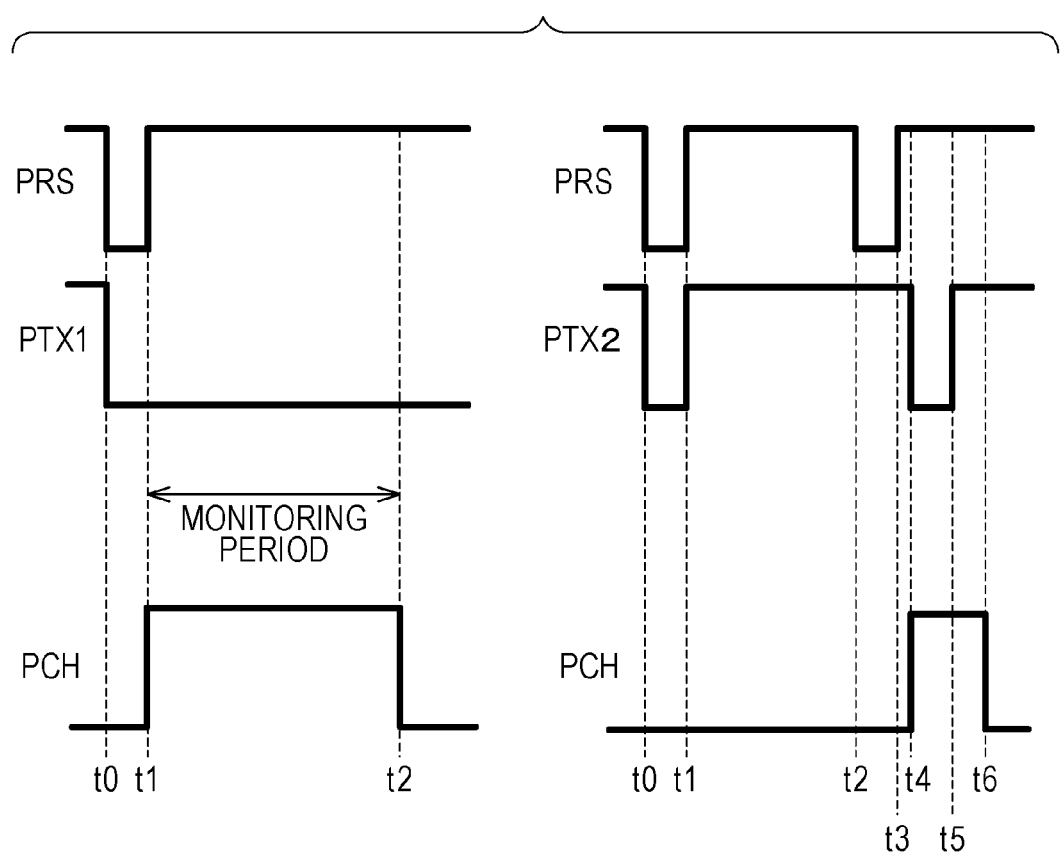
FIG. 9 illustrates a driving timing according to the second exemplary embodiment.

FIG. 9 is a timing chart illustrating a driving method of the photoelectric conversion apparatus 10 according to the present exemplary embodiment. The drawing on the left of FIG. 9 is a timing chart of the electric charge monitoring unit pixel 21 and is similar to the timing chart of FIG. 4. The drawing on the right of FIG. 9 is a timing chart of the electric charge accumulating unit pixel 21 and is similar to the timing chart of FIG. 6. According to the present exemplary embodiment, the electric charge monitoring unit pixel 21 and the electric charge accumulating unit pixel 21 where the linearity of the characteristics is satisfied in both the pixels are arranged in the same line. According to the present exemplary embodiment, it is possible to satisfy the linearity of both the signal for monitoring the light reception amount obtained from the electric charge monitoring unit pixel 21 and the high S/N signal having little noise which is obtained from the electric charge accumulating unit pixel 21 in the same line.

Third Exemplary Embodiment

Figure 10:
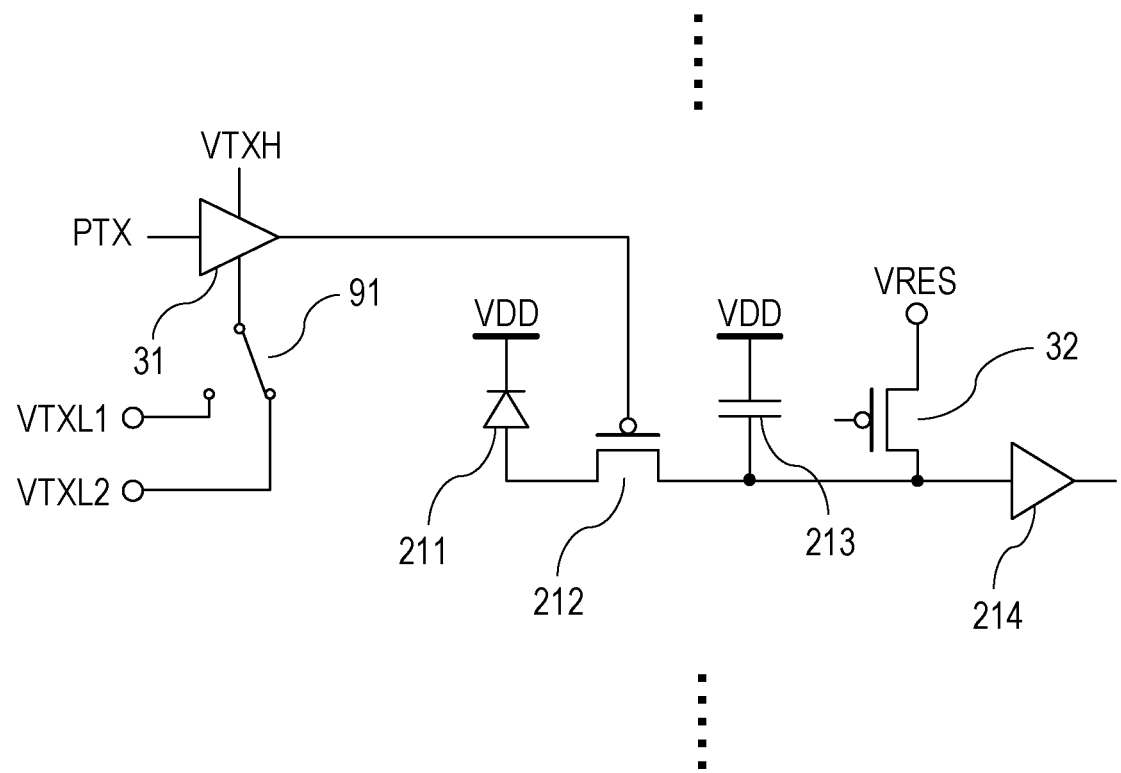
FIG. 10 is an equivalent circuit diagram the pixel unit according to a third exemplary embodiment.

FIG. 10 is an equivalent circuit diagram illustrating an example configuration of the base unit line sensor 12 according to a third exemplary embodiment of the present invention. The plurality of same unit pixels 21 are arranged in the base unit line sensor 12. Here, the unit pixel 21 will be described. In FIG. 10, the same component members as those in FIG. 3 are assigned with the same reference symbols. A difference of the present exemplary embodiment from the first exemplary embodiment resides in that a switch 91 is provided. The switch 91 can switch the low level voltage of the buffer amplifier 31 for transmitting the control signal to the gate of the transfer transistor 212 to VTXL1 or VTXL2. That is, each of the electric charge monitoring unit pixel 21 and the electric charge accumulating unit pixel 21 includes the switch 91 that can switch the on-state voltage VTXL1 or VTXL2 supplied to the gate of the transfer transistor 212. Herein, a relationship VTXL1>VTXL2 is established.

According to the present exemplary embodiment, in a case where the unit pixel is used as the electric charge monitoring unit pixel 21, the low level voltage VTXL1 is supplied to the buffer amplifier 31 by the switch 91, and the driving timing is set to be the same as FIG. 4. In a case where the unit pixel is used as the electric charge accumulating unit pixel 21, the low level voltage VTXL2 is supplied to the buffer amplifier 31 by the switch 91, and the driving timing is set to be the same as FIG. 6.

According to the present exemplary embodiment, the unit pixel in FIG. 10 can be used as the electric charge monitoring unit pixel 21 or the electric charge accumulating unit pixel 21 depending on use purposes. For example, in a case where focusing is performed while the light reception amount is monitored under a bright environment, the unit pixel is used as the electric charge monitoring unit pixel 21, and in a case where a high S/N is to be used under a dark environment, the unit pixel can be used as the electric charge accumulating unit pixel 21. The reference unit line sensor 13 is also similar to the base unit line sensor 12.

During a certain electric charge accumulating period, one first unit pixel 21 of the unit pixel 21 is operated as the electric charge monitoring unit pixel 21, and the second unit pixel 21 of another unit pixel 21 is operated as the electric charge accumulating unit pixel 21. During another electric charge accumulating period, the first unit pixel 21 may be operated as the electric charge accumulating unit pixel 21, and the second unit pixel 21 may be operated as the electric charge monitoring unit pixel 21.

Fourth Exemplary Embodiment

Figure 11:
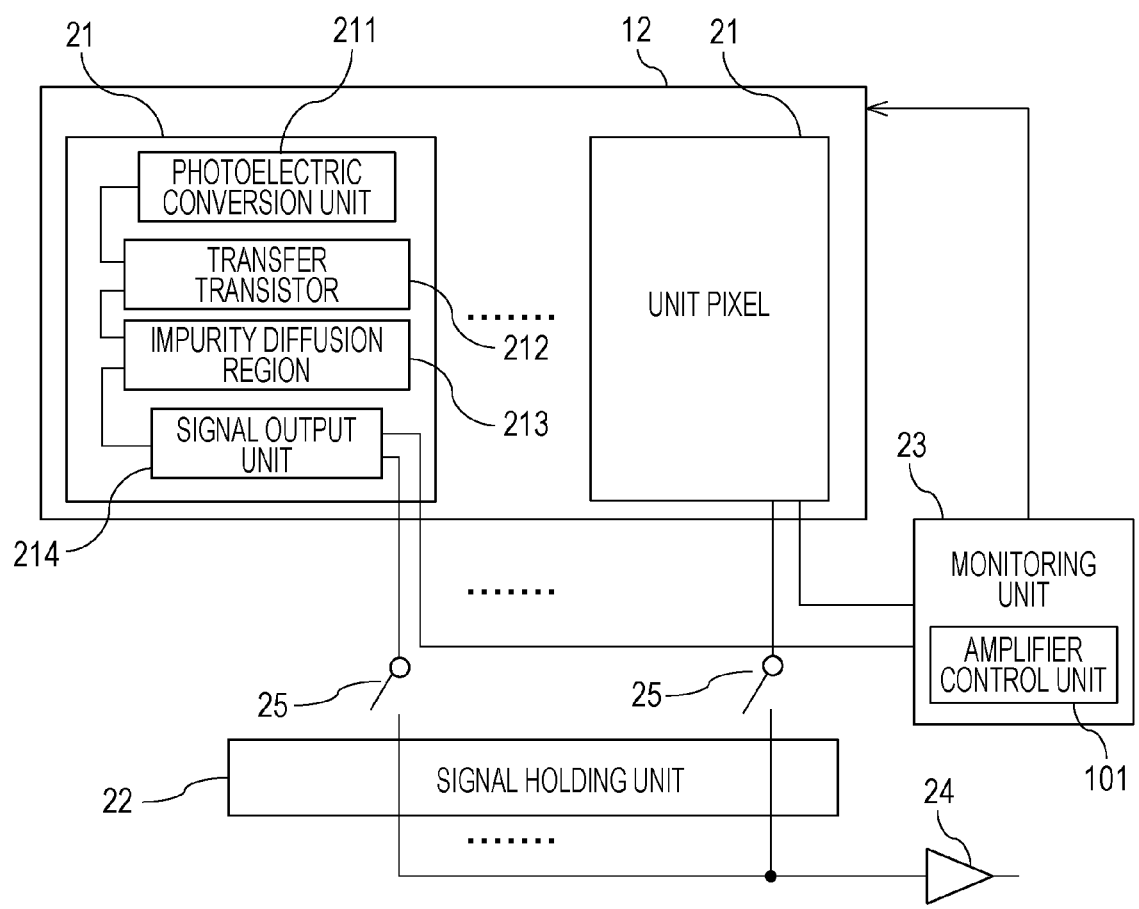
FIG. 11 illustrates a configuration of the line sensor according to a fourth exemplary embodiment.

FIG. 11 illustrates an example configuration of the base unit line sensor 12 and its peripheral circuit according to a fourth exemplary embodiment of the present invention. In FIG. 11, the same constituent components as those in FIG. 2 are assigned with the same reference symbols. A difference between of the present exemplary embodiment (FIG. 11) from the first exemplary embodiment (FIG. 2) resides in that an amplifier control unit 101 is provided in the monitoring unit 23. In a case where the monitoring unit 23 determines that an amplitude of the P-B signal is small, the amplifier control unit 101 obtains an amplification factor used to set the amplitude to be sufficiently large. An amplifier that is not illustrated in the drawing amplifies the signal at the above-described amplification factor, and the signal is output from the amplifier 24. That is, the amplifier control unit 101 controls the amplification factor of the electric charge accumulating unit pixel 21 (and the electric charge monitoring unit pixel 21) on the basis of the output signal of the electric charge monitoring unit pixel 21. The amplifier control unit 101 is a control unit configured to control the amplification factor of the amplifier 24 corresponding to an amplification unit on the basis of the signal level of the signal based on the electric charges generated by the photoelectric conversion unit. According to the present exemplary embodiment, even in a case where the amplitude of the P-B signal is small, the signal is amplified by the appropriate amplification factor and output, so that the sufficiently large signal amplitude can be obtained. The reference unit line sensor 13 is also similar to the base unit line sensor 12.

Fifth Exemplary Embodiment

Figure 12:
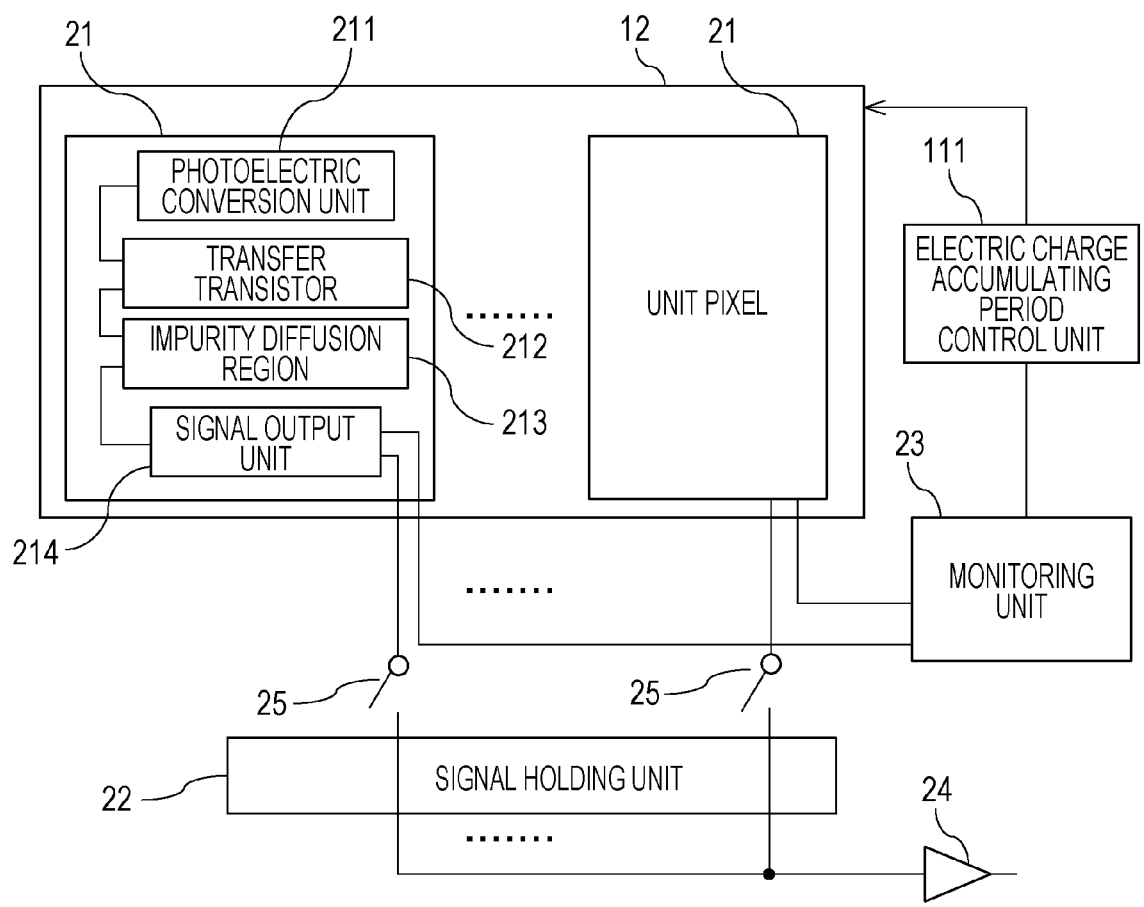
FIG. 12 illustrates a configuration of the line sensor according to a fifth exemplary embodiment.

FIG. 12 illustrates an example configuration of the base unit line sensor 12 and its peripheral circuit according to a fifth exemplary embodiment of the present invention. In FIG. 12, the same constituent components as those in FIG. 2 are assigned with the same reference symbols. A difference between of the present exemplary embodiment (FIG. 12) from the first exemplary embodiment (FIG. 2) resides in that an electric charge accumulating period control unit 111 is provided between the monitoring unit 23 and the base unit line sensor 12. When the monitoring unit 23 determines that the amplitude of the P-B signal exceeds the previously set threshold, a signal for instructing the end of the electric charge accumulating period is output to the electric charge accumulating period control unit 111. The electric charge accumulating period control unit 111 that has received the signal controls the transfer transistors 212 included in the respective electric charge accumulating unit pixels 21 and transfers the electric charges accumulated in the photoelectric conversion unit 211 to the impurity diffusion region 213. Accordingly, the electric charge accumulating period is ended. That is, the monitoring unit 23 ends the electric charge accumulating period of the electric charge monitoring unit pixel 21 and the electric charge accumulating unit pixel 21 on the basis of the output signal of the electric charge monitoring unit pixel 21. According to the present exemplary embodiment, while the electric charge accumulating period is controlled by the electric charge accumulating period control unit 111, it is possible to obtain the signal amplitude having the desired size. The reference unit line sensor 13 is also similar to the base unit line sensor 12.

Sixth Exemplary Embodiment

Figure 13:
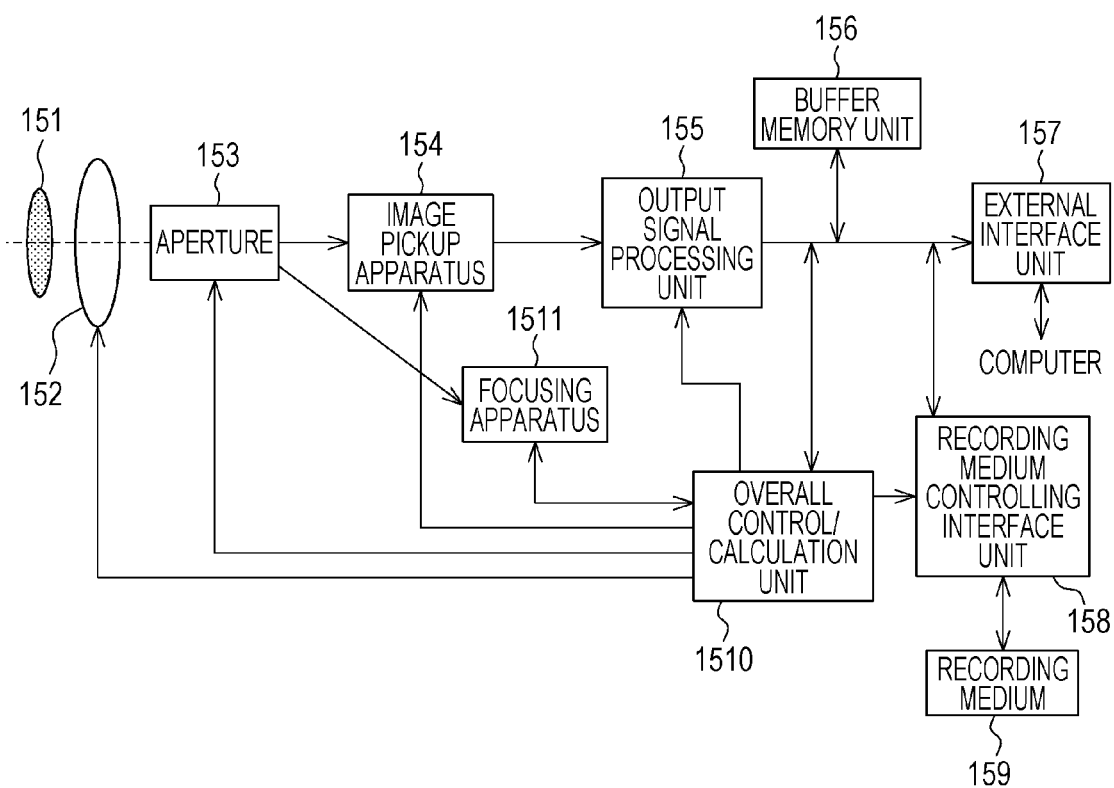
FIG. 13 illustrates an example photoelectric conversion system.

FIG. 13 illustrates an example configuration of the photoelectric conversion system according to a sixth exemplary embodiment of the present invention. In the photoelectric conversion system, the photoelectric conversion apparatus 10 according to the first to fifth exemplary embodiments is used as a focusing apparatus 1511. The photoelectric conversion system includes a barrier 151 for protecting a lens 152, the lens 152 for focusing an optical image of a subject on the focusing apparatus 1511 and an image pickup apparatus 154, and an aperture 153 for setting the amount of light that has passed through the lens 152 to be variable. The photoelectric conversion system further includes an output signal processing unit 155 that performs processing on a signal output from the image pickup apparatus 154. The image pickup apparatus 154 generates an image pickup signal by image pickup operation to generate an image obtained by picking up the subject. The output signal processing unit 155 appropriately performs various corrections and compression on the image pickup signal output from the image pickup apparatus 154 to generate the image. The lens 152 and the aperture 153 constitute an optical system for focusing light on the image pickup apparatus 154. The light focused by the optical system is also supplied to the focusing apparatus 1511.

The photoelectric conversion system also includes a buffer memory unit 156 configured to temporarily store image data and an external interface unit 157 configured to communicate with an external computer or the like. The photoelectric conversion system further includes a detachably attachable recording medium 159 such as a semiconductor memory for recording or reading image pickup data, a recording medium controlling interface unit 158 configured to perform recording and reading of the recording medium 159. Furthermore, the photoelectric conversion system includes an overall control/calculation unit 1510 configured to control various calculations and an entire still camera.

The photoelectric conversion system also includes the focusing apparatus 1511. The focusing apparatus 1511 operates on the basis of the signal output from the overall control/calculation unit 1510. Focusing data is output from the focusing apparatus 1511 to the overall control/calculation unit 1510. The overall control/calculation unit 1510 determines whether or not focusing is realized on the basis of the focusing data output from the focusing apparatus 1511, and when it is determined that the focusing is not realized, the overall control/calculation unit 1510 drives the lens 152. When it is determined that the focusing is realized on the basis of the focusing data output again from the focusing apparatus 1511, the overall control/calculation unit 1510 causes the image pickup apparatus 154 to perform the image pickup operation.

The focusing apparatus 1511 provided in the photoelectric conversion system can adopt a mode of the photoelectric conversion apparatus 10 described in the first to fifth exemplary embodiments. Accordingly, it is also possible to attain the benefits described in the first to fifth exemplary embodiments with the focusing apparatus 1511 in the photoelectric conversion system.

It is noted that, any of the above-described exemplary embodiments is merely an example of the embodiment for carrying out the present invention, and the exemplary embodiments shall not be construed as limiting the technical scope of the present invention. That is, the present invention can be carried out in various forms without departing from the technical thought or its main characteristic.

The linearity of the characteristics in both the first unit pixel and the second unit pixel can be improved by varying the potential at the channel when the first transfer transistor and the second transfer transistor are turned on.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-022535, filed Feb. 7, 2014, which is hereby incorporated by reference herein in its entirety.

What is claimed is:

1. A photoelectric conversion apparatus comprising:
a first unit pixel, and
a second unit pixel,
wherein
the first unit pixel includes a first photoelectric conversion unit, a first transfer transistor, and a first impurity diffusion region,
the second unit pixel includes a second photoelectric conversion unit, a second transfer transistor, and a second impurity diffusion region,
the first transfer transistor transfers electric charges generated by the first photoelectric conversion unit to the first impurity diffusion region when the first transfer transistor is turned on during an electric charge accumulating period,
the second photoelectric conversion unit accumulates generated electric charges during the electric charge accumulating period, and the second transfer transistor transfers the electric charges generated by the second photoelectric conversion unit to the second impurity diffusion region when the second transfer transistor is turned on after the electric charge accumulating period is ended, and
a potential at a channel of the first transfer transistor when the first transfer transistor is on-state is higher than a potential at a channel of the second transfer transistor when the second transfer transistor is on-state.

2. The photoelectric conversion apparatus according to claim 1, wherein the first impurity diffusion region and the second impurity diffusion region are a same impurity diffusion region.

3. The photoelectric conversion apparatus according to claim 2, wherein the first unit pixel and the second unit pixel are arranged in a same line.

4. The photoelectric conversion apparatus according to claim 1, wherein
the first transfer transistor and the second transfer transistor are p-channel MOS field effect transistors, and
an on-state voltage of a gate for turning on the first transfer transistor is higher than an on-state voltage of a gate for turning on the second transfer transistor.

5. The photoelectric conversion apparatus according to claim 1, wherein
the first transfer transistor and the second transfer transistor are n-channel MOS field effect transistors, and
an on-state voltage of a gate for turning on the first transfer transistor is lower than an on-state voltage of a gate for turning on the second transfer transistor.

6. The photoelectric conversion apparatus according to claim 4, wherein the on-state voltage of the second transfer transistor is a voltage at which the electric charges accumulated by the second photoelectric conversion unit can be completely transferred from the second photoelectric conversion unit to the second impurity diffusion region.

7. The photoelectric conversion apparatus according to claim 5, wherein the on-state voltage of the second transfer transistor is a voltage at which the electric charges accumulated by the second photoelectric conversion unit can be completely transferred from the second photoelectric conversion unit to the second impurity diffusion region.

8. The photoelectric conversion apparatus according to claim 1, wherein
the first transfer transistor and the second transfer transistor are p-channel MOS field effect transistors, and
a threshold voltage of the first transfer transistor is higher than a threshold voltage of the second transfer transistor.

9. The photoelectric conversion apparatus according to claim 1, wherein
the first transfer transistor and the second transfer transistor are n-channel MOS field effect transistors, and
a threshold voltage of the first transfer transistor is lower than a threshold voltage of the second transfer transistor.

10. The photoelectric conversion apparatus according to claim 8, wherein an on-state voltage of a gate for turning on the first transfer transistor is the same as an on-state voltage of a gate for turning on the second transfer transistor.

11. The photoelectric conversion apparatus according to claim 9, wherein an on-state voltage of a gate for turning on the first transfer transistor is the same as an on-state voltage of a gate for turning on the second transfer transistor.

12. The photoelectric conversion apparatus according to claim 1, wherein
the second photoelectric conversion unit generates electric charges during another electric charge accumulating period that is different from the electric charge accumulating period, and the electric charges generated by the second photoelectric conversion unit are transferred to the second impurity diffusion region when the second transfer transistor is turned on during the other electric charge accumulating period,
the first photoelectric conversion unit accumulates generated electric charges during the other electric charge accumulating period, and the electric charges generated by the first photoelectric conversion unit are transferred to the first impurity diffusion region when the first transfer transistor is turned on after the other electric charge accumulating period is ended, and
the potential at the channel of the second transfer transistor when the second transfer transistor is turned on is higher than the potential at the channel of the first transfer transistor when the first transfer transistor is turned on during the other electric charge accumulating period.

13. The photoelectric conversion apparatus according to claim 1, further comprising:
a monitoring unit configured to end the electric charge accumulating period on the basis of a signal based on the electric charges generated by the first photoelectric conversion unit.

14. The photoelectric conversion apparatus according to claim 1, further comprising:
an amplification unit configured to amplify a signal based on the electric charges accumulated by the second photoelectric conversion unit; and
a control unit configured to control an amplification factor of the amplification unit on the basis of a signal based on the electric charges generated by the first photoelectric conversion unit.

15. A photoelectric conversion apparatus comprising:
a first unit pixel, and
a second unit pixel,
wherein
the first unit pixel includes a first photoelectric conversion unit, a first transfer transistor, and a first impurity diffusion region, the second unit pixel includes a second photoelectric conversion unit, a second transfer transistor, and a second impurity diffusion region, the first transfer transistor transfers electric charges generated by the first photoelectric conversion unit to the first impurity diffusion region when the first transfer transistor is turned on during an electric charge accumulating period, the second photoelectric conversion unit accumulates generated electric charges during the electric charge accumulating period, and the second transfer transistor transfers electric charges generated by the second photoelectric conversion unit to the second impurity diffusion region when the second transfer transistor is turned on after the electric charge accumulating period is ended, and a voltage difference between an on-state voltage and an off-state voltage supplied to a gate of the first transfer transistor is smaller than a voltage difference between an on-state voltage and an off-state voltage supplied to a gate of the second transfer transistor.

16. The photoelectric conversion apparatus according to claim 15, wherein the first impurity diffusion region and the second impurity diffusion region are a same impurity diffusion region.

17. A photoelectric conversion system comprising:
the photoelectric conversion apparatus according to claim 1;
a lens that focuses an optical image of a subject on the photoelectric conversion apparatus; and
a calculation unit configured to determine whether or not focusing is realized on the basis of an output signal of the photoelectric conversion apparatus and drives the lens when it is determined that the focusing is not realized.

18. The photoelectric conversion system according to claim 17, further comprising:
an image pickup apparatus configured to generate an image pickup signal by image pickup operation,
wherein
the lens focuses the optical image of the subject on the image pickup apparatus, and
the calculation unit causes the image pickup apparatus to perform the image pickup operation when it is determined that the focusing is realized.

19. The photoelectric conversion system according to claim 17, wherein in photoelectric conversion apparatus, the first impurity diffusion region and the second impurity diffusion region are a same impurity diffusion region.

20. The photoelectric conversion system according to claim 19, wherein in photoelectric conversion apparatus, the first unit pixel and the second unit pixel are arranged in a same line.

* * * * *